(12) United States Patent
Shimazawa et al.

(10) Patent No.: US 7,656,621 B2
(45) Date of Patent: Feb. 2, 2010

(54) MAGNETO-RESISTIVE ELEMENT HAVING A CAP LAYER FOR CANCELING SPIN INJECTION EFFECT

(75) Inventors: Koji Shimazawa, Tokyo (JP); Daisuke Miyauchi, Tokyo (JP); Tomohito Mizuno, Tokyo (JP); Yoshihiro Tsuchiya, Tokyo (JP)

(73) Assignee: TDK Corporation, Tokyo (JP)

( * ) Notice: Subject to any disclaimer, the term of this patent is extended or adjusted under 35 U.S.C. 154(b) by 494 days.

(21) Appl. No.: 11/581,478

(22) Filed: Oct. 17, 2006

(65) Prior Publication Data

US 2007/0086120 A1 Apr. 19, 2007

(30) Foreign Application Priority Data

Oct. 17, 2005 (JP) ............................. 2005-301580

(51) Int. Cl.
*G11B 5/33* (2006.01)
*G11B 5/127* (2006.01)
(52) U.S. Cl. ................................ 360/324.12; 360/324.2
(58) Field of Classification Search ............ 360/324.12, 360/324.1, 324.2, 322
See application file for complete search history.

(56) References Cited

U.S. PATENT DOCUMENTS

| 6,084,752 A | 7/2000 | Sakakima et al. |
| 6,381,107 B1 * | 4/2002 | Redon et al. ............. 360/324.2 |
| 6,400,537 B2 | 6/2002 | Sakakima et al. |
| 2003/0137785 A1 | 7/2003 | Saito |
| 2004/0207959 A1 * | 10/2004 | Saito ....................... 360/324.1 |

FOREIGN PATENT DOCUMENTS

| JP | 09-288807 A | 11/1997 |
| JP | 2003-218428 A | 7/2003 |

OTHER PUBLICATIONS

L. Berger, "Emission of spin waves by a magnetic multilayer traversed by a current," The American Physical Society, vol. 54, No. 13, Oct. 1996.
J.C. Slonczewski, "Current-driven excitation of magnetic multilayers," Elsevier Science B.V., 1996.
Jian-Gang Zhu et al., "Current induced noise in CPP spin valves," IEEE Transactions on Magnetics, vol. 40, No. 4, pp. 2323-2325. Jul. 2004.

* cited by examiner

*Primary Examiner*—Andrea L Wellington
*Assistant Examiner*—Gustavo Polo
(74) *Attorney, Agent, or Firm*—Oliff & Berridge, PLC

(57) ABSTRACT

A magneto-resistive element has: a first stacked film assembly having a pinned layer, a spacer layer, and a free layer; a first electrode layer which is arranged such that the first layer is in contact with the first electrode layer on the other side of the first layer, the first electrode layer being made of a ferromagnetic material; and a second electrode layer which is arranged on a side that is opposite to the first electrode layer with regard to the first stacked film assembly. The first and second electrode layers are adapted to apply a sense current to the first stacked film assembly and the first layer in a direction that is perpendicular to layer surfaces. The first layer is made of gold, silver, copper, ruthenium, rhodium, iridium, chromium or platinum, or an alloy thereof.

21 Claims, 11 Drawing Sheets

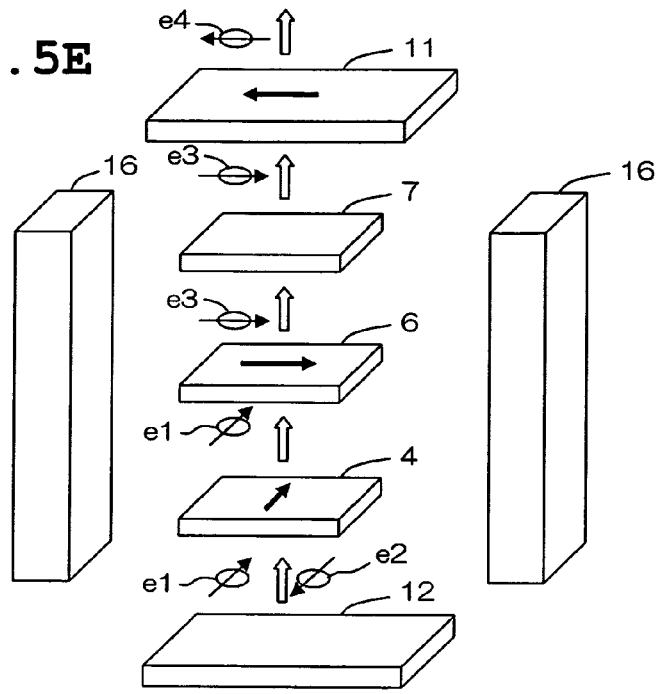
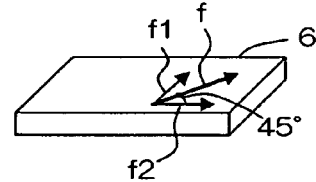
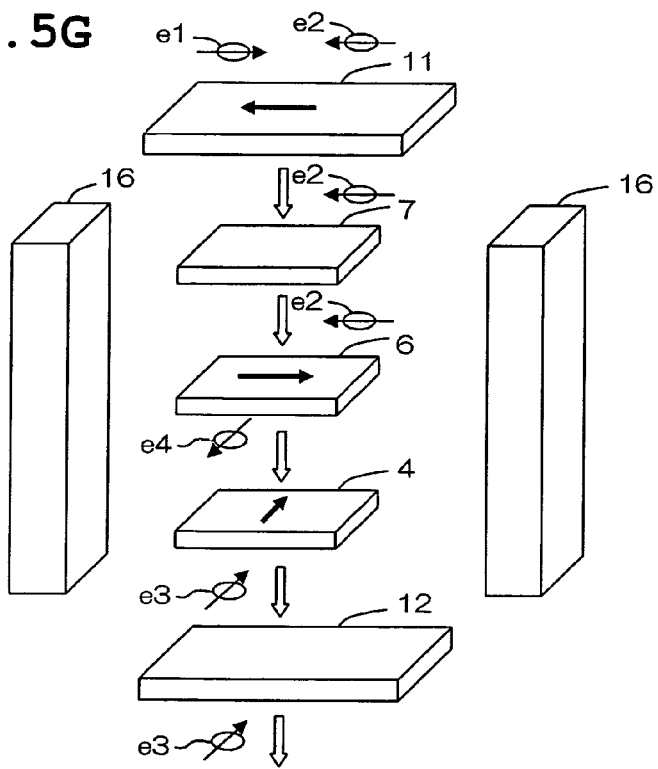
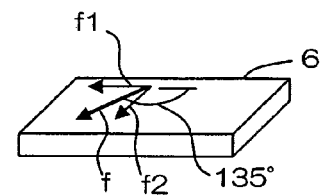

MAGNETO-RESISTIVE ELEMENT HAVING A CAP LAYER FOR CANCELING SPIN INJECTION EFFECT

The present application is based on, and claims priority from, J.P. Application No. 2005-301580, filed on Oct. 17, 2005, the disclosure of which is hereby incorporated by reference herein in its entirety.

BACKGROUND OF THE INVENTION

1. Field of the Invention

The present invention mainly relates to a magneto-resistive element, and particularly relates to the structure of a cap layer of a CPP-GMR element.

2. Description of the Related Art

In accordance with the development of hard disk drives (HDD) toward higher density, a thin-film magnetic head having improved performance has been required. A composite thin-film magnetic head, in which a read head portion having a magneto-resistive element (MR element) for reading data and a write head potion having an inductive electromagnetic transducer for recording data are stacked, is widely used for a thin-film magnetic head. A magneto-resistive element is arranged inside insulating films (inter-shield insulating films) which are provided between first and second shield layers. The inter-shield insulating films are provided to electrically insulate the magneto-resistive element from the first and second shield layers in order to prevent leakage of sense current.

With the increase in recording density, the need for a narrower shield gap and a narrower track width has been increasing. To cope with this requirement, Japanese Patent Application Laid-Open Publication No. 288807/97 discloses a head structure in which first and second shield layers and a magneto-resistive element are electrically connected in series to make the inter-shield insulation films unnecessary. In this structure, since the magneto-resistive element is in contact with the shield layers via non-magnetic metal layers, a narrower shield gap is achieved with lesser possibility for dielectric breakdown between shield layers. Such a magneto-resistive element is called a CPP-GMR (Current Perpendicular to the Plane Giant Magneto-Resistance) element because it operates with electric current that flows in a direction perpendicular to layer surfaces. A CPP-GMR element is promising as a magneto-resistive element for a read head portion that requires a track width of 0.1 µm or less and a height of 0.1 µm or less.

The structure in which a magneto-resistive element is connected to shield layers via metal layers has the advantage that it has improved heat radiation efficiency and a capability for higher operating current. Further, if the element has a small cross section, then it exhibits a larger electric resistance and, at the same time, a larger change in resistance. In other words, a CPP-GMR element has the advantage that it is suitable for achieving a narrow track width.

However, it is reported that when a large amount of electric current is applied to operate a CPP-GMR element, magnetic noise due to "spin injection effect" occurs. For example, refer to "Emission of Spin Waves by a Magnetic Multilayer Traversed by a Current" by L. Berger, Physical Review B (USA), American Physical Society, page 54, No. 13, vol. 54, October, 1996, and "Current-driven Excitation of Magnetic Multilayers" by J. C. Slonczewski, Journal of Magnetism and Magnetic Materials (USA), Elsevier Science B.V., pages L1 to L7, vol. 159, 1996.

The spin injection effect is a phenomenon that spin-polarized conduction electrons in the pinned layer enter the free layer via a non-magnetic spacer layer (e.g., a Cu layer), and interact with electrons that govern the magnetic state of the free layer, thereby disturbing the magnetic state of the free layer.

FIGS. 1, 2A to 2C are schematic diagrams for illustrating the spin injection effect. FIG. 1 is a schematic diagram showing an essential part of the film structure of a CPP-GMR element, and FIGS. 2A to 2C are schematic diagrams showing magnetization states of a free layer. In a CPP-GMR element, pinned layer 104, spacer layer 105 consisting of a non-magnetic and conductive layer, and free layer 106 are formed adjacent to each other in this order, as shown in FIG. 1. The magnetization of pinned layer 104 is fixed in magnetization direction S1 irrespective of the external magnetic field. Free layer 106 is magnetized in magnetization direction S2 under the influence of a bias magnetic field which is generated by hard magnetic layers, not shown, that are arranged on both sides of free layer 106. The magnetization direction of free layer 106 is rotated by external magnetic field that is generated by a recording medium, not shown. Magneto-resistance is changed in accordance with the amount of rotation, and thereby magnetic information is read from the recording medium.

Cap layer 107, which is made of, for example, tantalum (Ta) or titanium (Ti), is arranged in contact with free layer 106. Cap layer 107 is provided to protect the surface of a wafer during manufacturing processes, and to ensure workability when a bar is lapped to form an air bearing surface, which is the surface of a thin-film magnetic head that faces a recording medium. Cap layer 107 may also be made of hafnium (Hf), niobium (Nb), zirconium (Zr), molybdenum (Mo), tungsten (W) etc. See, for example, Japanese Patent Application Laid-Open Publication No. 2003-218428.

First electrode layer 111 is formed in contact with cap layer 107. Second electrode layer 112 is formed on the side of pinned layer 104. The first and second electrode layers, which are formed of, for example, NiFe, have the function of providing magnetic shields for free layer 106, as well as the function of electrodes for applying electric current to pinned layer 104, spacer layer 105, and free layer 106 in a direction perpendicular to the layer surfaces.

When sense current C is applied, conduction electrons flow in direction D that is opposite to the direction of the current. Conduction electrons having spins in various directions are supplied from second electrode 112. When the conduction electrons reach pinned layer 104, conduction electrons having a spin direction that is directed to the same direction as magnetization direction S1 of pinned layer 104 (called conduction electrons e1 hereinafter) are apt to pass through pinned layer 104 by virtue of the spin polarization effect of pinned layer 104. However, conduction electrons having a spin direction that is directed to the opposite direction are less apt to pass through pinned layer 104, because they are reflected inside pinned layer 104. As a result, conduction electrons e1 having a spin direction that is directed to the same direction as magnetization direction S1 are allowed to pass through pinned layer 104 (spin polarized), and to enter free layer 106 via spacer layer 105.

As described above, free layer 106 is magnetized in magnetization direction S2, which is parallel to the layer surface and is perpendicular to magnetization direction S1 of pinned layer 104. Assume that free layer 106 is magnetized in magnetization direction S3 that is inclined by some degrees to magnetization direction S2, as shown in FIG. 2A. When conduction electrons e1 are injected, the magnetization direction of each magnetic domain, like precession of a spinning top, begins to rotate due to interaction with electrons that govern the magnetic state of free layer 106, and, at the same time, each magnetic domain is subject to torque F which gradually directs the magnetization direction of the magnetic domain toward magnetization direction S1. Since torque F is directed to magnetization direction S1 at any time, regardless of the magnetization direction of the magnetic domain, the magnetization direction of the magnetic domain is finally aligned with magnetization direction S1, as shown in FIGS. 2B and 2C. Torque F is proportional to the quantity of conduction electrons e1 that have been injected, i.e., the magnitude of sense current. The above phenomenon is called magnetization reversal by spin injection, or spin transfer, and torque F is called spin transfer torque.

This phenomenon implies that the magnetization state of the free layer may vary without being affected by an external magnetic field. This phenomenon may generate noise, and is disadvantageous for developing a more highly sensitive magnetic head.

A dual spin valve structure is proposed as a means for canceling the spin injection effect. For example, see "Current Induced Noise in CPP Spin valves" by J. Z. Zhu et al., IEEE Transactions on Magnetics, USA, pp. 2323-2325, No. 4, vol. 40, July, 2004. This structure enables spin-polarized conduction electrons that flow from a pinned layer on one side to efficiently remove the influence of conduction electrons that flow from another pinned layer on the other side.

However, a dual spin valve, in which a free layer is sandwiched by two pinned layers, tends to have a larger film thickness due to the additional pinned layer. Since the direction of the film thickness of a spin valve used in a thin-film magnetic head is aligned to the circumferential direction of a recording medium, it is difficult for a film structure having a large film thickness to achieve a short recording pitch in the circumferential direction of a recording medium, or a narrow shield gap. However, a film structure, other than a dual spin valve, that can reduce noise caused by spin injection effect has not yet been proposed.

SUMMARY OF THE INVENTION

It is therefore an object of the present invention to provide a magneto-resistive element having a small film thickness and a potential for a narrow shield gap, and that is suitable for reducing noise due to spin injection effect.

It is another object of the present invention to provide a head gimbal assembly, hard disk drive etc. which use such a magneto-resistive element.

A magneto-resistive element of the present invention comprises: a first stacked film assembly having a pinned layer whose magnetization direction is fixed against an external magnetic field, a spacer layer that is made of a non-magnetic and conductive material, and a free layer whose magnetization is changed in accordance with the external magnetic field, the pinned layer, the spacer layer, and the free layer being arranged in this order adjacent to each other; a first layer which is arranged such that the first layer is in contact with the free layer on one side of the first layer; a first electrode layer which is arranged such that the first layer is in contact with the first electrode layer on the other side of the first layer, the first electrode layer being made of a ferromagnetic material; and a second electrode layer which is arranged on a side that is opposite to the first electrode layer with regard to the first stacked film assembly. The first and second electrode layers are adapted to apply a sense current to the first stacked film assembly and the first layer in a direction that is perpendicular to layer surfaces. The first layer is made of gold, silver, copper, ruthenium, rhodium, iridium, chromium or platinum, or an alloy thereof.

In a magneto-resistive element provided with such a film structure, the sense current flows through the free layer in a direction that is perpendicular to the layer surface. Since the pinned layer is arranged on one side of the free layer, only electrons having a spin direction that is directed in the same direction as the fixed magnetization direction of the pinned layer (spin polarized electrons) are allowed to pass through the pinned layer due to the spin polarization effect, and to flow into the free layer from the side of the pinned layer. On the other hand, since a first electrode layer, which is made of a ferromagnetic material, is arranged on the side opposite to the free layer, only electrons having a spin direction that is directed in the same direction as the magnetization direction of the first electrode layer (spin polarized electrons) are allowed to pass through the first electrode layer. Gold, silver, copper, ruthenium, rhodium, iridium, chromium and platinum, and any alloy thereof have the characteristic to allow spin polarized electrons to pass therethrough. Accordingly, electrons having a spin direction that is directed in the same direction as the magnetization direction of the first electrode layer are not blocked by the first layer on the way to the first electrode layer, and reach the first electrode layer. As a result, electrons having a spin direction that is anti-parallel to the magnetization direction of the first electrode layer are accumulated near the free layer. This phenomenon is equivalent to the state in which electrons having a spin direction that is opposite to the magnetization direction of the first electrode layer flow into the free layer. The electrons flowing from the pinned layer and the equivalent electrons flowing from the first electrode layer both exert spin injection effect, which works to change the magnetization direction of the free layer, on the free layer. However, the electrons that flow from one side of the free layer and the electrons that flow from the other side of the free layer have spin directions that are different from each other. This contributes, by that degree, to mutual cancellation of the spin injection effect that the electrons flowing from each side exert on the free layer. As a result, the magnetic influence on the free layer can be mitigated compared to prior art in which the free layer is subject to the spin injection effect only from the pinned layer.

In the present invention, the first electrode layer acts to cancel the spin injection effect that the pinned layer applies to the free layer, and the magnetic influence on the free layer can be mitigated, as described above. As a result, a magneto-resistive element can be provided that has a small film thickness and a potential for a narrow shield gap and that is suitable for reducing noise due to spin injection effect.

According to another embodiment, the magneto-resistive element may further comprise hard magnetic layers which are disposed on both sides of at least the free layer in a plane parallel to an air bearing surface. In this embodiment, a boundary surface of the first electrode layer that faces the first layer is formed substantially to be flat. The sense current is adapted to flow from the second electrode layer to the first electrode layer. The first electrode layer is magnetized in a direction that is substantially parallel to a magnetization direction of the free layer, the free layer being magnetized by the hard magnetic layers.

According to yet another embodiment, the magneto-resistive element may further comprise hard magnetic layers which are disposed on both sides of at least the free layer in a plane parallel to an air bearing surface. In this embodiment, a boundary surface of the first electrode layer that faces the first layer is formed substantially to be flat The sense current is adapted to flow from the first electrode layer to the second electrode layer. The first electrode layer is magnetized in a direction that is substantially anti-parallel to a magnetization direction of the free layer, the free layer being magnetized by the hard magnetic layers.

According to yet another embodiment, the first electrode layer may have a stepped portion that projects toward the first stacked film assembly, the stepped portion extending along a direction that is substantially perpendicular to an air bearing surface, and wherein the stepped portion is magnetized in a direction that is substantially parallel to a magnetization direction of the pinned layer.

A thin-film magnetic head of the present invention has a magneto-resistive element mentioned above.

A wafer of the present invention is used to manufacture a thin-film magnetic head mentioned above. The wafer comprises the magneto-resistive element.

A head gimbal assembly of the present invention comprises: a slider that includes the thin-film magnetic head mentioned above, the slider being configured to be arranged opposite to a recording medium; and a suspension for elastically supporting the slider.

A hard disk device of the present invention comprises: a slider that includes the thin-film magnetic head mentioned above, the slider being configured to be arranged opposite to a disc-shaped recording medium that is rotatably driven; and a positioning device for supporting the slider and for positioning the slider relative to the recording medium.

A magnetic memory device of the present invention comprises: a plurality of magneto-resistive elements mentioned above; a plurality of lines which are connected to the plurality of magneto-resistive elements, the lines being configured selectively to write information to one of the magneto-resistive elements, and selectively to read information from one of the magneto-resistive elements.

A magnetic sensor assembly of the present invention comprises: a substrate which is provided with the magneto-resistive element mentioned above; and a lead line which is connected to the magneto-resistive element and which outputs magnetic information of the external magnetic field, the magnetic information being detected by the magneto-resistive element.

The above and other objects, features and advantages of the present invention will become apparent from the following description with reference to the accompanying drawings which illustrate examples of the present invention.

BRIEF DESCRIPTION OF THE DRAWINGS

FIG. 5E is a schematic diagram for illustrating the operation of the first embodiment of the present invention;

FIG. 5F is a diagram for schematically illustrating spin transfer torque acting on the free layer in FIG. 5E;

FIG. 5G is a schematic diagram for illustrating the operation of the first embodiment (comparative example) of the present invention;

FIG. 5H is a diagram for schematically illustrating spin transfer torque acting on the free layer in FIG. 5G;

DETAILED DESCRIPTION OF THE INVENTION

The First Embodiment

Figure 1:
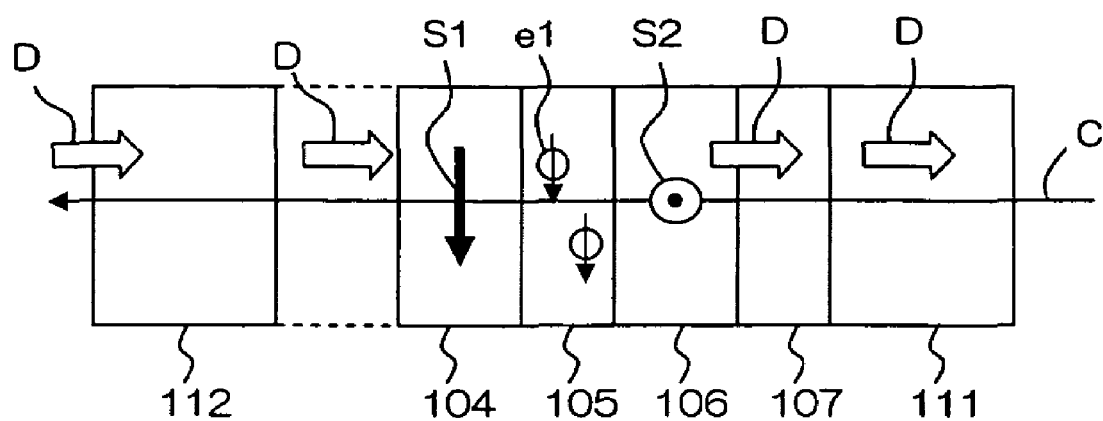
FIG. 1 is a schematic diagram showing the essential part of a film structure of a CPP-GMR element.
Figure 2A:
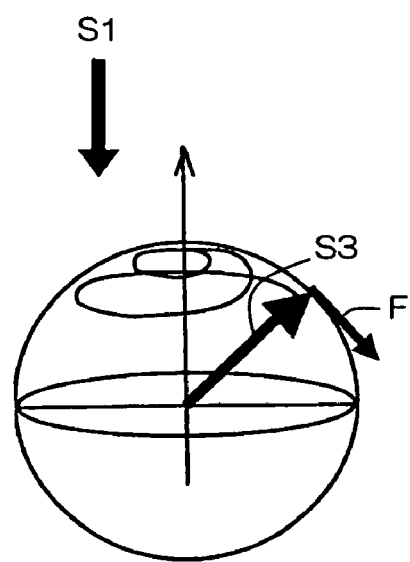
FIGS. 2A to 2C are schematic diagrams showing magnetization states of a free layer.
Figure 2B:
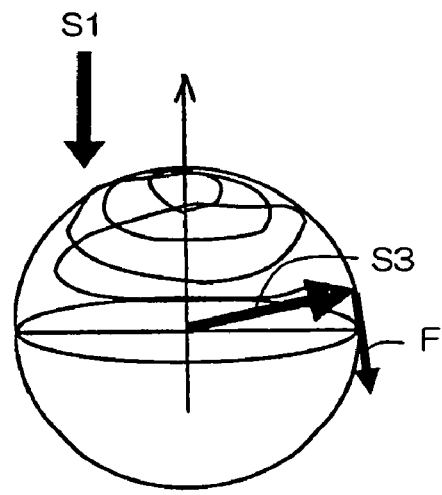
Figure 2C:
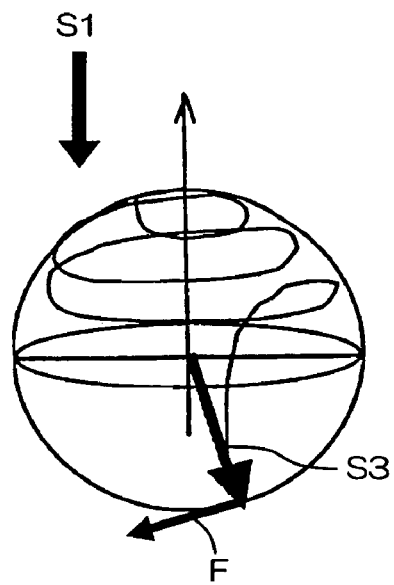
Figure 3:
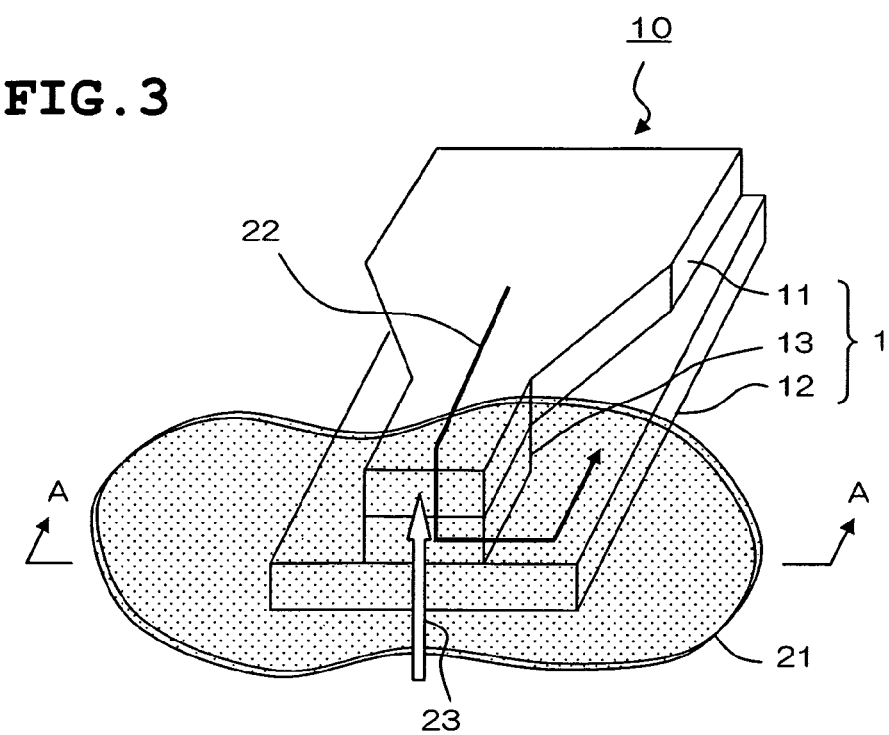
FIG. 3 is a perspective view showing a part of a thin-film magnetic head using a magneto-resistive element of the present invention.
Figure 4:
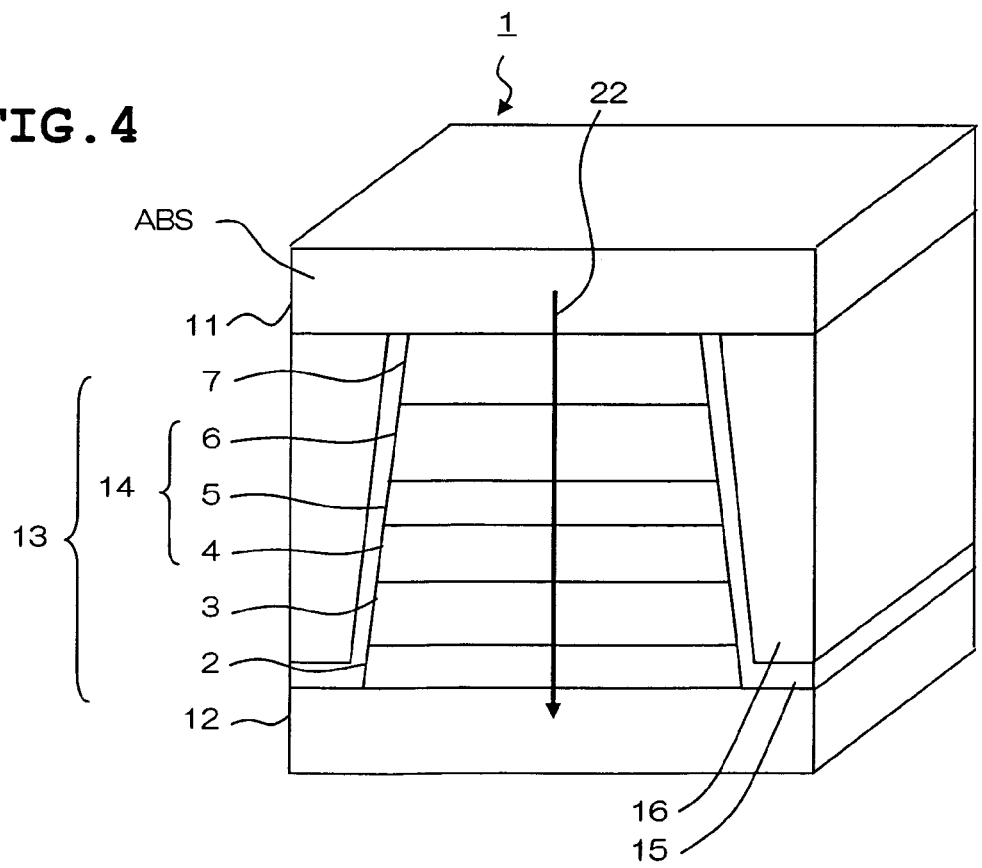
FIG. 4 is a perspective view showing the stacking structure of a magneto-resistive element of the first embodiment of the present invention, viewed from direction A-A (from the air bearing surface) in FIG. 3.

The first embodiment of a magneto-resistive element of the present invention will be described with reference to the drawings. FIG. 3 is a perspective view showing a part of a thin-film magnetic head using a magneto-resistive element of the present invention. FIG. 4 is a perspective view showing the stacking structure of the magneto-resistive element, viewed from direction A-A (from the air bearing surface) in FIG. 3. Thin-film magnetic head 10 may be a read only head, or may be a composite thin-film magnetic head that further has an inductive electromagnetic transducer for writing, not shown.

As shown in FIG. 3, magneto-resistive element 1 has a structure in which spin valve film 13 is sandwiched between first electrode layer 11 and second electrode layer 12. In this specification, magneto-resistive element 1 means an assembly of stacked layers as a whole, which are made of spin valve film 13 and first and second electrode layers 11, 12 that sandwich spin valve film 13. First and second electrode layers 11, 12 are made of ferromagnetic material such as NiFeCr, NiFe. Spin valve film 13 has first stacked film assembly 14 that is comprised of pinned layer 4 whose magnetization direction is fixed against an external magnetic field, spacer layer 5 that is made of a non-magnetic and conductive material such as Cu, and free layer 6 whose magnetization direction is changed in accordance with an external magnetic field. Pinned layer 4, spacer layer 5, and free layer 6 are arranged adjacent to each other in this order. Pinned layer 4 and free layer 6 are made of, for example, CoFe. A Cu layer may be inserted in order to enhance the interface scattering effect and thereby to improve MR ratio. Pinned layer 4 may be a so-called synthetic pinned layer in which an inner pinned layer and an outer pinned layer are antiferromagnetically coupled with each other via a non-magnetic intermediate layer that is sandwiched therebetween. A first layer (also referred to as cap layer 7 hereinbelow) is provided above first stacked film assembly 14. Cap layer 7 is in contact with free layer 6 on one side, and is in contact with first electrode layer 11 on the other side. First layer 7 may be made of gold, silver, copper, ruthenium, rhodium, iridium, chromium or platinum, or any alloy thereof. First layer 7 may be comprised of a plurality of layers each consisting of gold, silver, copper, ruthenium, rhodium, iridium, chromium or platinum, or any alloy thereof. The boundary surface of first electrode layer 11 that faces first layer 7 is formed substantially to be flat. The structure of cap layer 7 will be described in detail in an 'Example' which will be described later.

Buffer layer 2 made of, for example Ta/NiCr, and antiferromagnetic layer 3 made of, for example IrMn, are provided on the lower side of pinned layer 4. Second electrode layer 12 is provided on the lower side of buffer layer 2 and antiferromagnetic layer 3. In other words, second electrode layer 12 is arranged on the side that is opposite to first electrode layer 11 with regard to first stacked film assembly 14 A substrate, not shown, is further provided below second electrode layer 12.

Hard magnetic layers 16 are disposed on both sides of free layer 6 in a plane parallel to ABS (Air Bearing Surface) via insulating films 15. Insulating films 15, which are made of, for example, $Al_2O_3$, prevent leakage of the sense current. Hard magnetic layers 16 govern magnetic domains of free layer 6 to promote magnetizing free layer 6 into a single magnetic domain, and preferably, are formed at least on both side of free layer 6. Hard magnetic layers 16 are made of, for example, CoPt, or CoCrPt.

First and second electrode layers 11, 12 are adapted to apply sense current 22 to spin valve film 13 in a direction that is perpendicular to layer surfaces The magnetic field that magneto-resistive element 1 (free layer 6) receives from magnetic medium 21 varies in accordance with rotation of recording medium 21 in moving direction 23. Magneto-resistive element 1 detects a change in a magnetic field as a change in electric resistance of sense current 22 that is obtained by the GMR effect, and thereby reads magnetic information recorded in each domain of recording medium 21.

Next, the operation of the present invention will be described. FIGS. 5A, 5C, 5E, and 5G are schematic diagrams showing the influence of the spin injection effect on the free layer in relation to the magnetization directions of the free layer and the first electrode layer, as well as the direction of the sense current. FIGS. 5B, 5D, 5F, and 5H are diagrams for schematically illustrating spin transfer torque acting on the free layer for the respective cases. In FIGS. 5A, 5C, 5E, and 5G, free layer 6 is magnetized rightward by hard magnetic layers 16. A part of the layers that constitutes the magneto-resistive element described above is omitted in the drawings. Black arrows indicate the magnetization direction of each layer. White arrows indicate the direction in which electrons flow, and the sense current flows in the opposite direction.

Figure 5A:
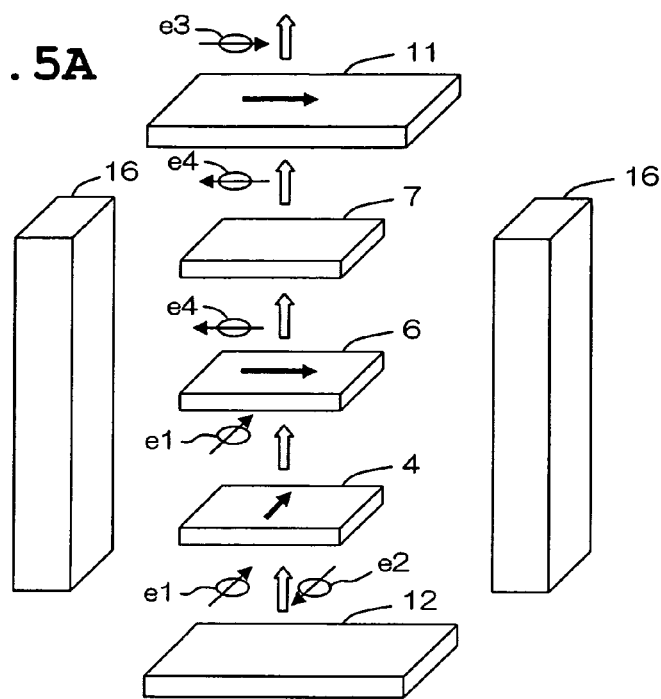
FIG. 5A is a schematic diagram for illustrating the operation of the first embodiment (comparative example) of the present invention.
Figure 5B:
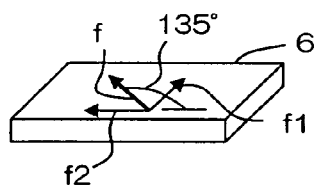
FIG. 5B is a diagram for schematically illustrating spin transfer torque acting on the free layer in FIG. 5A.

FIG. 5A shows a case in which the first electrode layer is magnetized rightward in the drawing and in which electrons of the sense current flow upwards. Assume, for simplicity, that electrons e1 having a spin direction that is parallel to the magnetization direction of pinned layer 4 and electrons e2 having a spin direction that is anti-parallel thereto are injected into pinned layer 4, as shown in the figure, although electrons having diverse spin directions are injected from second electrode layer 12 into pinned layer 4. Since electrons e2 are blocked by pinned layer 4 due to the GMR effect, as described in the related art, electrons e1 tend to accumulate between pinned layer 4 and free layer 6. As is also described in the related art, electrons e1 apply torque to free layer 6 to magnetize free layer 6 into the magnetization direction of pinned layer 4, which is caused by the spin injection effect. FIG. 5B schematically shows the direction of torque acting on free layer 6. This torque is represented by force f1 in the figure for convenience.

Next, first electrode layer 11 is magnetized rightward in the drawing. This means that electrons e3 having a spin direction that is parallel to the magnetization direction of first electrode layer 11 easily pass through first electrode layer 11. In other words, electrons e4 having a spin direction that is anti-parallel to the magnetization direction of first electrode layer 11 are less apt to pass through first electrode layer 11 due to the GMR effect that is caused by first electrode layer 11. Therefore, electrons e4 tend to accumulate between free layer 6 and first electrode layer 11. Electrons e4 act on free layer 6, similar to electrons e1, but unlike electrons e1, act on free layer 6 from the upper side of free layer 6 with regard to the direction of stacking, and exert a spin injection effect on free layer 6. This torque is represented by leftward force f2 in FIG. 5B. As a result, free layer 6 is subject to force f1 from the lower side with regard to the direction of stacking and force f2 from the upper side, and the magnetization direction of free layer 6 is directed to the direction of combined force f. Combined force f makes an angle of about 135 degrees with the magnetization direction of free layer 6, when force f1 and force f2 have the same magnitude. Accordingly, the present invention is not expected to have much of an effect for the case shown in FIG. 5A because of the relatively large influence of the spin injection effect.

Figure 5C:
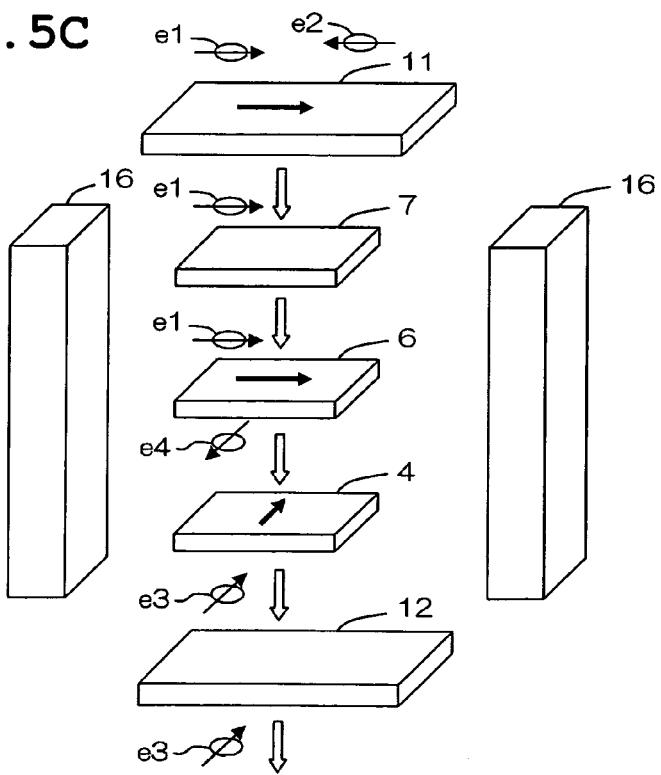
FIG. 5C is a schematic diagram for illustrating the operation of the first embodiment of the present invention.
Figure 5D:
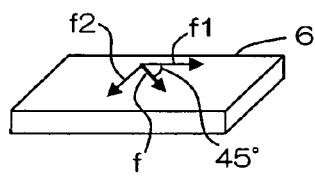
FIG. 5D is a diagram for schematically illustrating spin transfer torque acting on the free layer in FIG. 5C.

FIG. 5C shows a case in which electrons of the sense current flow downwards, opposite to FIG. 5A, while the first electrode layer is magnetized rightward in the drawing. Assume, similar to FIG. 5A, that electrons e1 having a spin direction that is parallel to the magnetization direction of first electrode layer 11 and electrons e2 having a spin direction that is anti-parallel thereto are injected into free layer 6, as shown in the figure, although electrons having diverse spin directions are injected from first electrode layer 11 into free layer 6. Since electrons e2 are blocked by first electrode layer 11, electrons e1 tend to accumulate between first electrode layer 11 and free layer 6, as described in the related art. What is important is that first layer 7 has a characteristic that allows electrons e1 (spin-polarized electrons), which pass through first electrode layer 11, to pass therethrough. Accordingly, the spin-polarized electrons are allowed to reach free layer 6. As is also described in the related art, electrons e1 that reach free layer 6 apply torque to free layer 6 to magnetize free layer 6 into the magnetization direction of first electrode layer 11, which is caused by the spin injection effect. In FIG. 5D, the direction of the torque that acts on the free layer is represented by force f1.

On the other hand, pinned layer 4 is magnetized in a front-to-back direction of the figure. This means that electrons e3 having a spin direction that is parallel to the magnetization direction of pinned layer 4 easily pass through pinned layer 4. In other words, electrons e4 having a spin direction that is anti-parallel to the magnetization direction of pinned layer 4 are less apt to pass through pinned layer 4 due to the GMR effect that is caused by pinned layer 4. Therefore, electrons e4 tend to accumulate between free layer 6 and pinned layer 4. Electrons e4 act on free layer 6 from the lower side of free layer 6 with regard to the direction of stacking and exert a spin injection effect on free layer 6. This torque is represented by back-to-front-ward force f2 in FIG. 5D. As a result, free layer 6 is subject to force f1 from the upper side with regard to the direction of stacking as well as force f2 from the lower side, and the magnetization direction of free layer 6 is directed to the direction of combined force f. Combined force f makes an angle of about 45 degrees with the magnetization direction of free layer 6, when force f1 and force f2 have the same magnitude. Accordingly, the present invention will exert an effect on the case shown in FIG. 5C because of the relatively limited influence of the spin injection effect.

FIGS. 5E and 5G show the cases in which first electrode layer 11 is magnetized leftward, unlike the cases of FIGS. 5A and 5C. In FIG. 5E, electrons of the sense current flow upward, similar to FIG. 5A, while in FIG. 5G, electrons of the sense current flow downward, similar to FIG. 5C. Although detailed description is omitted, the outline is as follows. In the case of FIG. 5E, the electrons that flow from pinned layer 4 to free layer 6 and the direction of force f1, which is caused by the electrons and which influences the magnetization direction of free layer 6, are the same as in FIGS. 5A and 5B. On the other hand, since first electrode layer 11 is magnetized in a direction opposite to that in FIG. 5A, electrons e3 tend to accumulate between first electrode layer 11 and free layer 6. Therefore, force f2 is directed in a direction opposite to that in FIG. 5B, as shown in FIG. 5F. As a result, combined force f makes an angle of about 45 degrees with the magnetization direction of free layer 6, and it is expected that the present invention will have an effect.

In the case of FIG. 5G, since first electrode layer 11 is magnetized in a direction opposite to that in FIG. 5C, electrons e2 tend to accumulate between first electrode layer 11 and free layer 6, and force f1 that influences the magnetization direction of free layer 6 is directed in a direction opposite to that in FIG. 5D, as shown in FIG. 5H. On the other hand, electrons that flow from free layer 6 to pinned layer 4 as well as the direction of force f2, which is caused by the electrons and which influences the magnetization direction of free layer 6, are the same as in FIG. 5D, as shown in FIG. 5H. As a result, combined force f makes an angle of about 135 degrees with the magnetization direction of free layer 6, and it is not expected that the present invention will have much of an effect.

In this way, the relationship between the magnetization direction of first electrode layer 11 and the direction of the sense current is important for limiting the influence of the spin injection effect. In summary, when sense current is adapted to flow from second electrode layer 12 to first electrode layer 11 (electrons flow from first electrode layer 11 to second electrode layer 12), as shown in FIG. 5C, it is desirable that first electrode layer 11 is magnetized in a direction that is substantially parallel to the magnetization direction of free layer 6, which is magnetized by hard magnetic layer 16. When sense current is adapted to flow from first electrode layer 11 to second electrode layer 12 (electrons flow from second electrode layer 12 to first electrode layer 11), as shown in FIG. 5E, it is desirable that first electrode layer 11 is magnetized in a direction that is substantially anti-parallel to the magnetization direction of free layer 6, which is magnetized by hard magnetic layer 16.

The Second Embodiment

Figure 6:
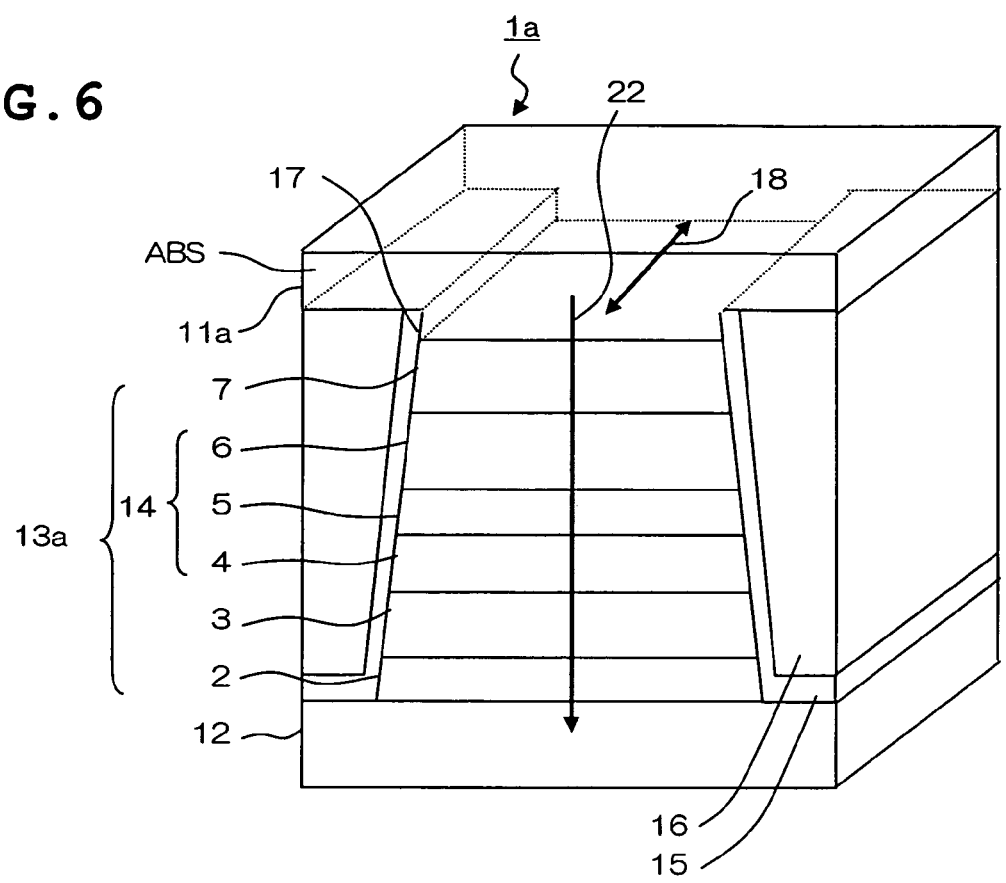
FIG. 6 is a perspective view showing the stacking structure of a magneto-resistive element of the second embodiment of the present invention, viewed from direction A-A (from the air bearing surface) in FIG. 3.

Next, the second embodiment of a magneto-resistive element of the present invention will be described in detail. FIG. 6 is an enlarged perspective view showing the stacking structure of a magneto-resistive element of the second embodiment, viewed from direction A-A (from the air bearing surface) in FIG. 3. Magneto-resistive effect element 1a of the present embodiment is different from the first embodiment as regards the shape of first electrode layer 11a. Specifically, first electrode 11a is provided with stepped portion 17 that extends along a direction that is substantially perpendicular to air bearing surface ABS. Stepped portion 17 projects toward first stacked film assembly 14. In other words, stepped portion 17 forms a downward projection of first electrode layer 11a. Other features are the same as in the first embodiment. Stepped portion 17 having such an elongate shape tends to be magnetized in the direction in which the stepped portion extends, or in longitudinal direction 18, due to the effect of shape anisotropy. Stepped portion 17 can be magnetized by applying an external magnetic field of the order of tens of thousands to hundreds of thousands A/m (order of hundreds to thousands Oe). Stepped portion 17 can also be magnetized either in the front-to-back direction or in the back-to-front direction of the figure. By using this characteristic, the influence of the spin injection effect can be limited in a more efficient manner. The magnetization direction of stepped portion 17 follows the direction in which an external magnetic field is applied, and therefore, when a magnetic field is applied in the back-to-front direction of the figure, stepped portion 17 is magnetized in the back-to-front direction.

Figure 7A:
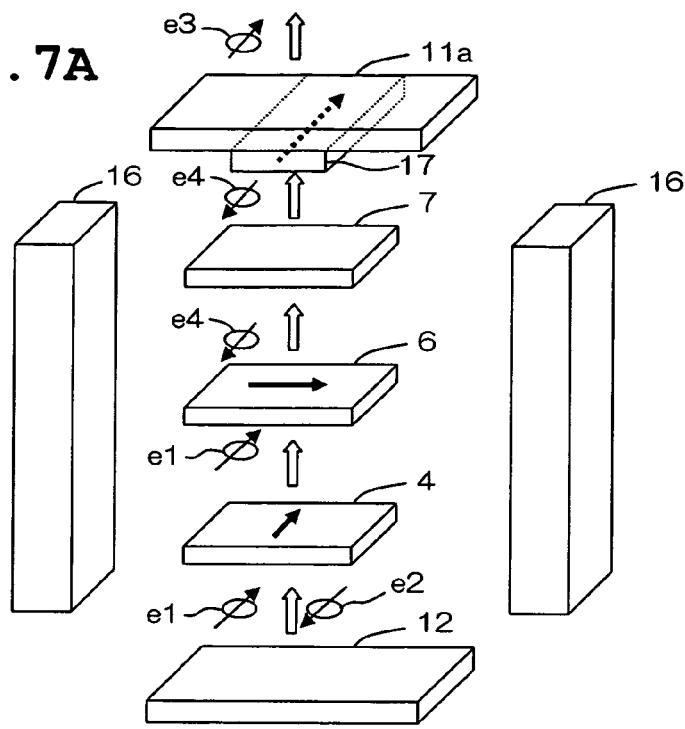
FIG. 7A is a schematic diagram for illustrating the operation of the second embodiment of the present invention.
Figure 7B:
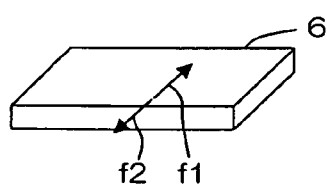
FIG. 7B is a diagram for schematically illustrating spin transfer torque acting on the free layer in FIG. 7A.
Figure 7C:
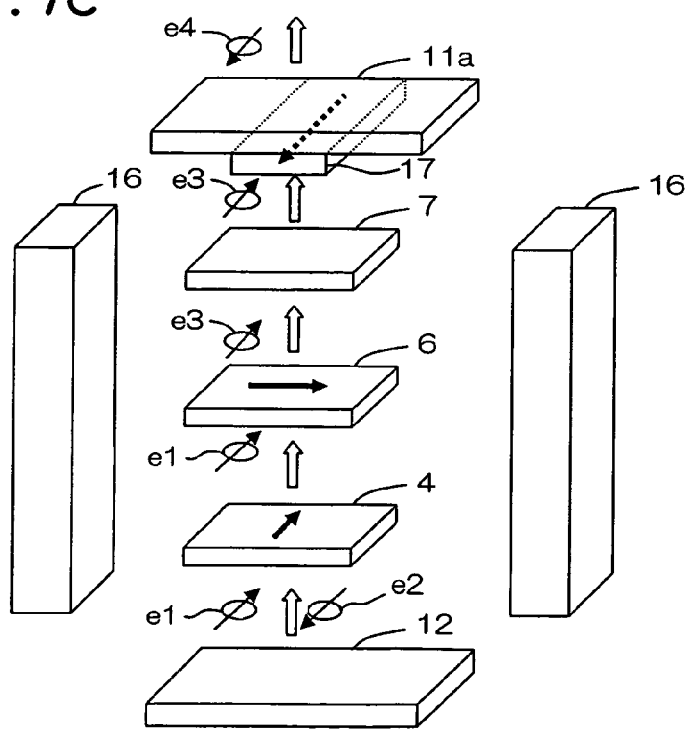
FIG. 7C is a schematic diagram for illustrating the operation of the second embodiment (comparative example) of the present invention.
Figure 7D:
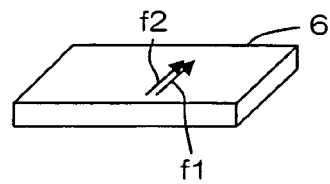
FIG. 7D is a diagram for schematically illustrating spin transfer torque acting on the free layer in FIG. 7C.

FIGS. 7A and 7C are schematic diagrams showing the influence of the spin injection effect on the free layer in relation to the magnetization directions of the pinned layer and the stepped portion of the first electrode layer. FIGS. 7B and 7D are diagrams for schematically illustrating the spin transfer torque that acts on the free layer in the respective cases. Each figure is depicted in the same manner as FIGS. 5A to 5H, though the magnetization direction of the first electrode layer is shown for the stepped portion.

FIG. 7A shows a case in which stepped portion 17 of first electrode layer 11a is magnetized in a direction that is parallel to the magnetization direction of pinned layer 4. Since electrons of the sense current flow upwards, the electrons that flow from pinned layer 4 to free layer 6 and the direction of force f1, which is caused by the electrons and which influences the magnetization direction of free layer 6, are the same as in FIG. 5B, as shown in FIG. 7B. On the other hand, since stepped portion 17 is magnetized in a direction that is parallel to the magnetization direction of pinned layer 4, electrons e3 easily pass through electrode layer 11a, while electrons e4 tend to accumulate between first electrode layer 11a and free layer 6. The direction of force f2, which is caused by the electrons and which influences the magnetization direction of free layer 6, is anti-parallel to force f1, as shown in FIG. 7B. As a result, force f1 and force f2 cancel out each other, and the effect of the present invention can be maximized. It should be noted that this case corresponds to a case in which one of a pair of pinned layers is replaced with first electrode layer 11a in a magneto-resistive element of a dual spin valve type which is described in the related art.

On the other hand, FIG. 7C shows a case in which stepped portion 17 of first electrode layer 11a is magnetized in a direction that is anti-parallel to the magnetization direction of pinned layer 4. As will be apparent from the foregoing, electrons e3 tend to accumulate between first electrode layer 11a and free layer 6 in this case, and the direction of force f2, which is caused by electrons e3 and which influences the magnetization direction of free layer 6 is the same as that of force f1, as shown in FIG. 7D. Therefore, the present invention is hardly expected to have any effect.

As described above, in a structure in which stepped portion 17 is formed in first electrode layer 11a, it is necessary that the magnetization direction of stepped portion 17 is parallel to the magnetization direction of pinned layer 4. In this structure, the direction of the sense current makes no difference to the result, and the magnetization direction of general portions of first electrode layer 11a, which do not include stepped portion 17, also makes little difference to the result.

Examples

Next, samples of magneto-resistive elements were prepared to study the noise reduction effect. The film structure and other measurement conditions were set as follows.
Element size: 0.1 μm×0.1 μm
Structure of the spin valve film: buffer layer (NiCr, film thickness 5 nm)/antiferromagnetic layer (IrMn, film thickness 7 nm)/outer pinned layer (CoFe, film thickness 3 nm)/non-magnetic intermediate layer (Ru, film thickness 0.8 nm)/inner pinned layer (CoFe, film thickness 4 nm)/spacer layer (Cu, film thickness 4 nm)/free layer (CoFe, film thickness 3 nm)/cap layer.
Range of noise measurement: maximum 2 GHz
Bias magnetic field: magnetic domain control was made by a bias magnetic field of t·Br=11.9 mA.

The expression A/B/C . . . indicates that the layers are stacked sequentially in the order of A, B, C, . . . , from the side of the substrate. Table 1 shows test parameters and measurement results. Numerals shown in the column 'Structure of Cap Layer' represent film thickness in nm. Sense current that flows from the first electrode layer to the second electrode layer is indicated with +(plus), and sense current that flows in the opposite direction is indicated with −(minus) (electrons flow in the opposite direction). Noise is shown in RMS (Root Mean Square) in the range from 0 to 2 GHz, because read frequency varies depending on the specifications of a device and the position of a head on a disk in an actual hard disk drive.

TABLE 1

| Case | First Electrode Layer | Electrode | Magnetization Direction of First Electrode Layer | Structure of Cap Layer | Sense Current (mA) | Noise (mV$_{rms}$) | Remark |
|---|---|---|---|---|---|---|---|
| 1-1 | Cu | Substantially flat | (Non-magnetic) | Ru2/Ta5 | +5 | 370 | Comparative Example (FIG. 8A) |
| 1-2 | | Substantially flat | (Non-magnetic) | | +12 | 515 | Comparative Example (FIG. 8B) |
| 2-1 | NiFe | Substantially flat | Parallel to Bias Magnetic Field of Hard Magnetic Layers | Ru2 | +12 | 864 | Comparative Example (FIG. 5A) |
| 2-2 | | | | | −12 | 411 | First Embodiment (FIG. 5C) |
| 2-3 | | | Anti-parallel to Bias Magnetic Field of Hard Magnetic Layers | | +12 | 405 | First Embodiment (FIG. 5E) |
| 2-4 | | | | — | −12 | 872 | Comparative Example (FIG. 5G) |
| 3-1 | NiFe | Stepped | Parallel to the Magnetization Direction of Pinned Layer | Ru2/Ta5 | +12 | 523 | Comparative Example |
| 3-2 | | | | Ru2 | | 381 | Second Embodiment (FIG. 7A) |
| 3-3 | | | | Ru3 | | 388 | |
| 3-4 | | | | Ru4 | | 392 | |
| 3-5 | | | | Ru5 | | 424 | |
| 3-6 | | | | Ru6 | | 516 | Comparative Example (FIG. 7A) |
| 3-7 | | | Anti-parallel to the Magnetization Direction of Pinned Layer | Ru2 | | 927 | Comparative Example (FIG. 7C) |

Figure 8A:
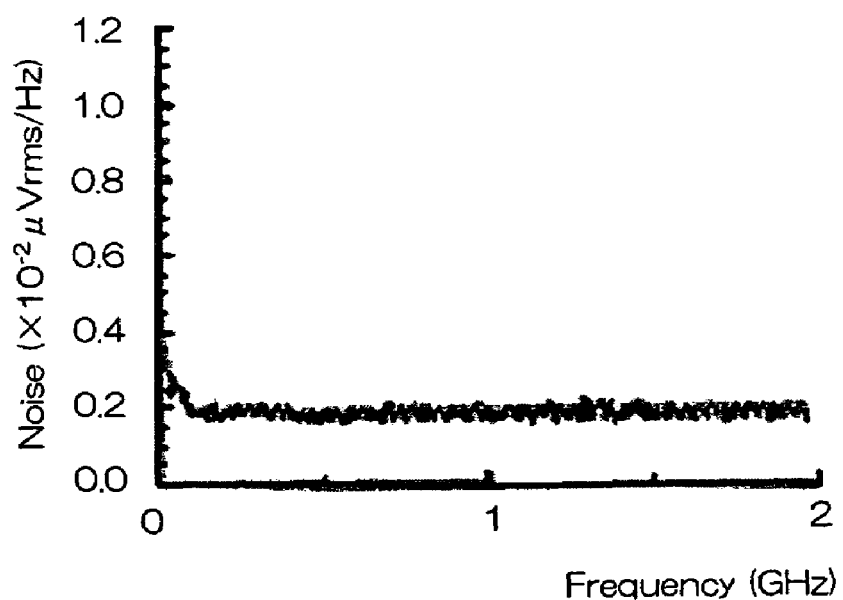
FIGS. 8A and 8B are charts showing examples of a noise spectrum that was measured.
Figure 8B:
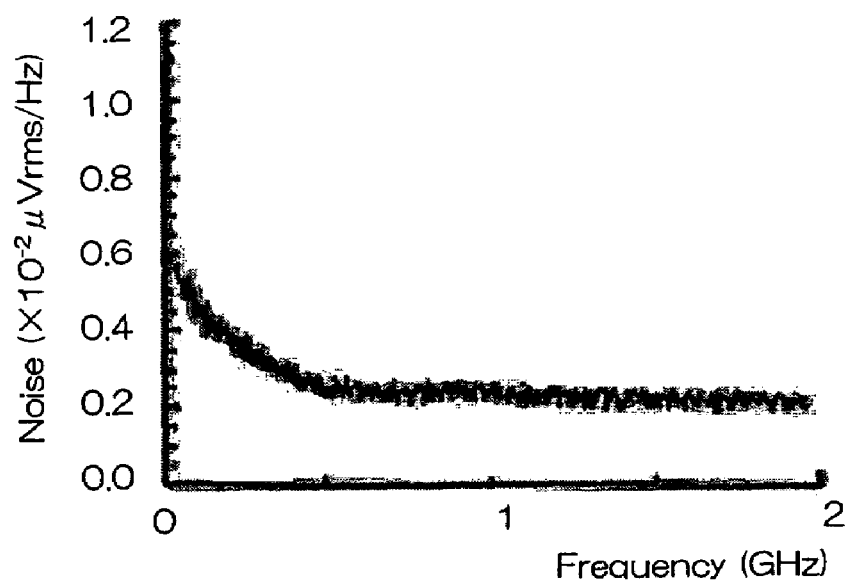

First, as comparative examples, noise was measured for magneto-resistive elements in which the first electrode layer was made of Cu and the cap layer was made of Ru/Ta (Case 1-1 and 1-2). FIG. 8A shows the noise spectrum for Case 1-1, and FIG. 8B shows the noise spectrum for Case 1-2. In these cases, since the first electrode layer is made of a non-magnetic material, the first electrode layer cannot contribute to canceling the spin injection effect. Accordingly, noise level increases when sense current is increased to 12 mA, although noise level is low when sense current is small (5 mA). Referring to FIGS. 8A and 8B, it should be understood that noise increased particularly in a low-frequency range. Since this frequency range is included in the actual frequency range for reading in a hard disk drive, the influence cannot be ignored.

Next, noise was measured for magneto-resistive elements in which the first electrode layer is made of NiFe and the cap layer is made of Ru having a film thickness of 2 nm (Case 2-1 to 2-4). Each case differs from the other cases in regard to the relationship between the magnetization direction of the first electrode layer and the direction of the bias magnetic field of the hard magnetic layer (parallel/anti-parallel) and in regard to the direction of the sense current. Case 2-1 to 2-4 correspond to the cases shown in FIG. 5A, 5C, 5E or 5G, respectively. As described above, the noise reduction effect is closely related to the direction of the bias magnetic field of the hard magnetic layers and to the direction of the sense current, and when the sense current flows from the second electrode layer to the first electrode layer (− current), it is desirable that the first electrode layer is magnetized such that its magnetization direction is substantially parallel to the magnetization direction of the free layer that is magnetized by the hard magnetic layers (Case 2-2). When sense current flows from the first electrode layer to the second electrode layer (+ current), it is desirable that the first electrode layer is magnetized such that its magnetization direction is substantially antiparallel to the magnetization direction of the free layer that is magnetized by the hard magnetic layers (Case 2-3). Thus, the effectiveness of the first embodiment was confirmed based on these examples.

Next, noise was measured for magneto-resistive elements in which the first electrode layer, which similarly was made of NiFe, was provided with a stepped portion and in which the stepped portion was magnetized in a direction that is parallel to the magnetization direction of the pinned layer. First, a stacked layer of Ru/Ta was used as the cap layer. This structure (Case 3-1) corresponds to a structure of an electrode layer and a cap layer according to conventional art. This structure showed a considerably high level of noise, which was as high as in Case 1-2, when a sense current of 12 mA was applied. The inventors think that this is because the effect of the first electrode layer of canceling the spin injection effect was lost due to the Ta layer. Specifically, if the first electrode layer is magnetized, then electrons having a spin direction that is parallel to the magnetization direction of the first electrode layer (spin polarized electrons) can preferentially pass through the first electrode layer via the free layer, as mentioned above. However, the passage of spin polarized electrons is blocked by the Ta layer. As a result, electrons having a spin direction of a particular direction are not accumulated near the free layer, and effect of canceling the spin injection effect is lost.

Next, some cases in which the cap layer was made of Ru alone were tested under the same conditions as in Case 3-1. The film thickness of the cap layer was changed as a parameter in order to study the influence of the film thickness (Case 3-2 to 3-6). The effect of noise reduction was confirmed for the cases in which the cap layer was made of Ru alone. The inventors think that this is because Ru has a characteristic to allow spin-polarized electrons to pass therethrough, and therefore, electrons having a spin direction of a particular direction are accumulated near the free layer. In this way, electrons can be controlled, as shown in FIG. 7A, by using Ru for the cap layer.

Further, it was found that the smaller the film thickness of the cap layer was, the lower the noise level became, and that the noise level became substantially equal to that of Case 3-1 (comparative example), when the film thickness was 6 nm. The inventors think that this is attributable to the spin scattering length of Ru. The spin scattering length is a distance in which the ratio of up-spin electrons and down-spin electrons is not equal. Polarization is lost if the distance is sufficiently longer than the scattering length. For this reason, if the film thickness is too large, then the characteristic of the Ru layer itself that allows spin polarized electrons to pass therethrough is lost, and electrons having a spin direction of a particular direction are not accumulated near the free layer. Although a film thickness of about 2 to 5 nm is desirable according to the present examples, the spin scattering length also depends on the manufacturing conditions, and it is reported that the spin scattering length of Ru can be maintained for a distance of 100 to 200 nm at maximum. Therefore, it should be noted that the film thickness is not limited to the range mentioned above. However, if the film thickness is within the range of about 2 to 5 nm, it is believed that the effect of noise reduction can be certainly ensured. As mentioned above, the cap layer may also be made of gold, silver, copper, ruthenium, rhodium, iridium, chromium or platinum, which, similar to ruthenium, are materials that exhibit the characteristic to allow spin polarized electrons to pass therethrough.

Noise was measured for Case 3-7 as a comparative example, in which the stepped portion was magnetized in a direction that is anti-parallel to the magnetization direction of the pinned layer. This cause showed the maximum noise level because the spin injection effect that is applied from the upper side of the free layer and that is applied from the lower side (from the pinned layer and from the first electrode layer) overlap, as described with reference to FIG. 7C.

From the comparison between Case 2-3 and Case 3-2, it is understood that the structure having a first electrode layer that is provided with a stepped portion is more advantageous for noise reduction. This result is consistent with the description in the second embodiment. However, in the structure having a first electrode layer that is provided with a stepped portion, the film thickness around the cap layer tends to be increased even if the film thickness of the cap layer above the free layer is limited. As a result, "side reading" from the side edges of the spin valve film, which is unfavorable for achieving a narrow shield gap, becomes conspicuous. When determining which structure to select, it is desirable to take into consideration the characteristic of the thin-film magnetic head on which the weight should be placed.

In the present embodiments, the magnetic influence on the free layer can be mitigated, because the cap layer works to cancel the spin injection effect of the pinned layer that acts on the free layer, as described above. Thus, a magneto-resistive element can be easily provided that is able to reduce noise that is caused by the spin injection effect. Further, a dual spin valve film is no longer required in the present embodiments. Accordingly, a narrow shield gap structure can also obtained easily by reducing the film thickness of the spin valve film.

Although the above description was made in regard to a so-called bottom spin structure in which the pinned layer is arranged on the side of a substrate, the present invention can also be applied in the same manner to a so-called top spin structure in which the free layer is arranged on the side of a substrate.

Figure 9:
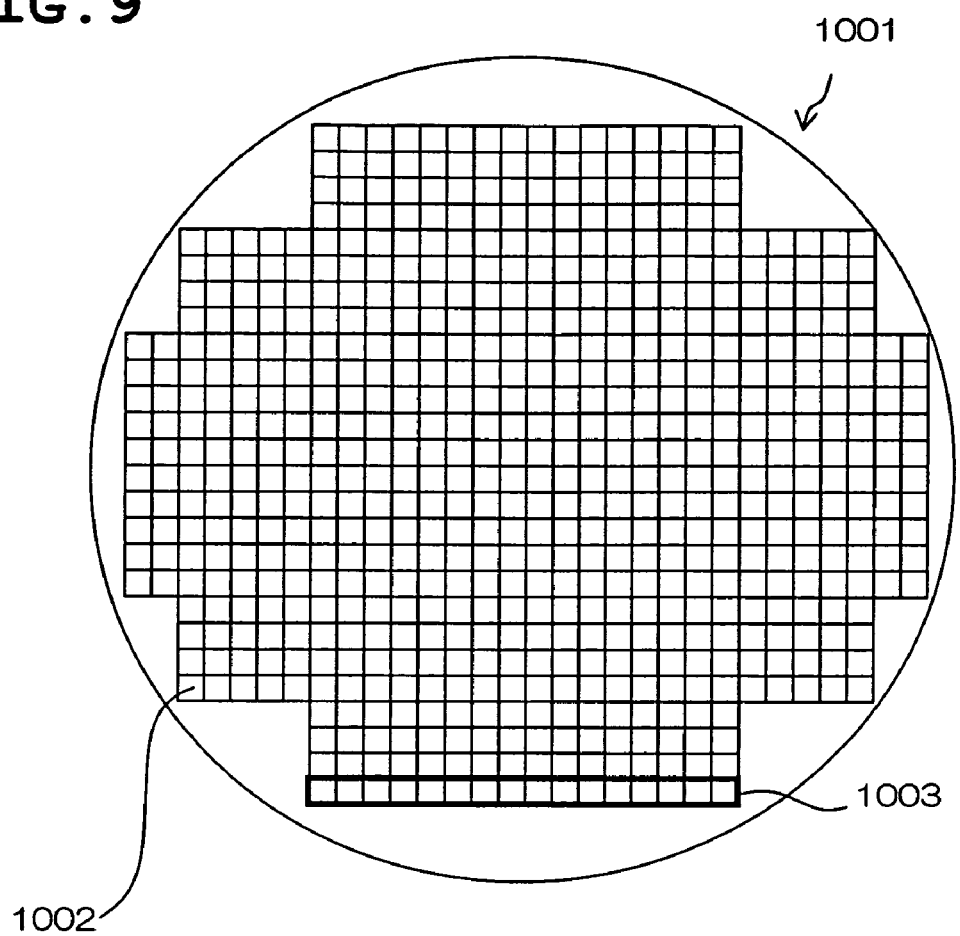
FIG. 9 is a plan view of a wafer that is used to manufacture the thin-film magnetic head according to the present invention.

Next, explanation will be made regarding a wafer for fabricating a thin-film magnetic head described above. FIG. 9 is a schematic plan view of a wafer. Wafer 1001 has a plurality of thin-film magneto-electric transducers 1002 which constitutes the thin-film magnetic head and which at least includes a stacked structure from second electrode layer 12 to first electrode layer 11. Wafer 1001 is diced into bars 1003, in which a plurality of thin-film magneto-electric transducers 1002 are formed in a row. Bar 1003 serves as a work unit in the process of forming ABS. Bar 1003 is diced into sliders each having a thin-film magnetic head after lapping. Spaces for dicing, not shown, are provided in wafer 1001 to dice wafer 1001 into bars 1003 and the sliders.

Figure 10:
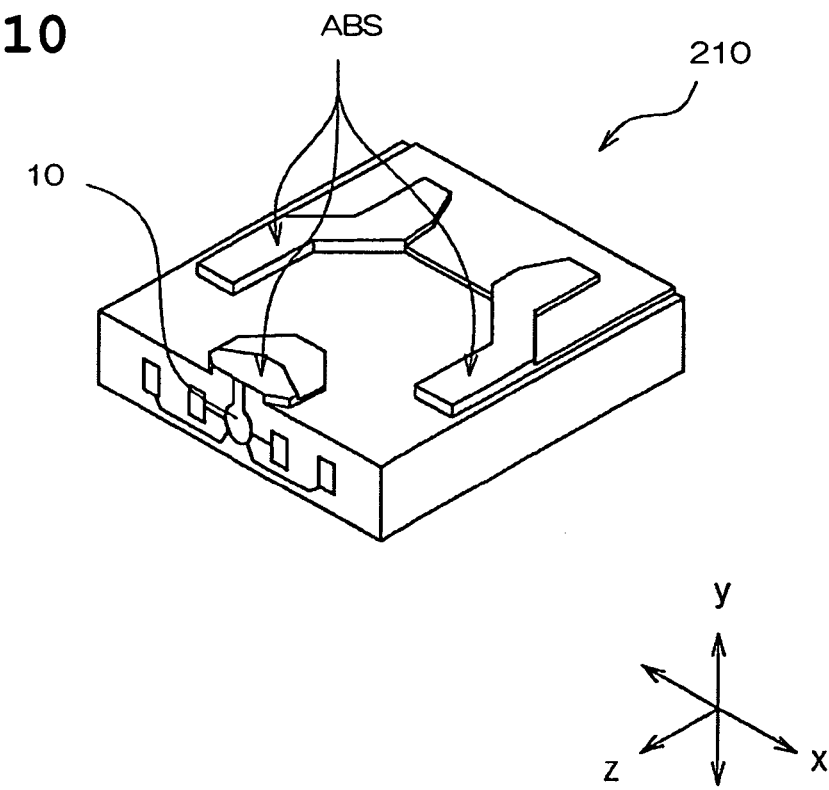
FIG. 10 is a perspective view of a slider that is included in a head gimbal assembly and that incorporates the thin-film magnetic head according to the present invention.

Explanation next regards a head gimbal assembly and a hard disk drive that uses the thin-film magnetic head. Referring to FIG. 10, slider 210 which is included in the head gimbal assembly will be described first. In a hard disk drive, slider 210 is a stacked layer assembly that is arranged opposite to a hard disk, which is a rotationally-driven disciform storage medium. Slider 210 has a substantially hexahedral form. One of the six surfaces of slider 210 forms ABS, which is positioned opposite to the hard disk. When the hard disk rotates in the z direction shown in FIG. 10, an airflow which passes between the hard disk and slider 210 creates a dynamic lift which is applied to slider 210 downward in the y direction of FIG. 10. Slider 210 is configured to lift up from the surface of the hard disk with this dynamic lift effect. In proximity to the trailing edge (the end portion at the lower left in FIG. 10) of slider 210, which is on the outlet side of the airflow, thin-film magnetic head 10 is formed.

Figure 11:
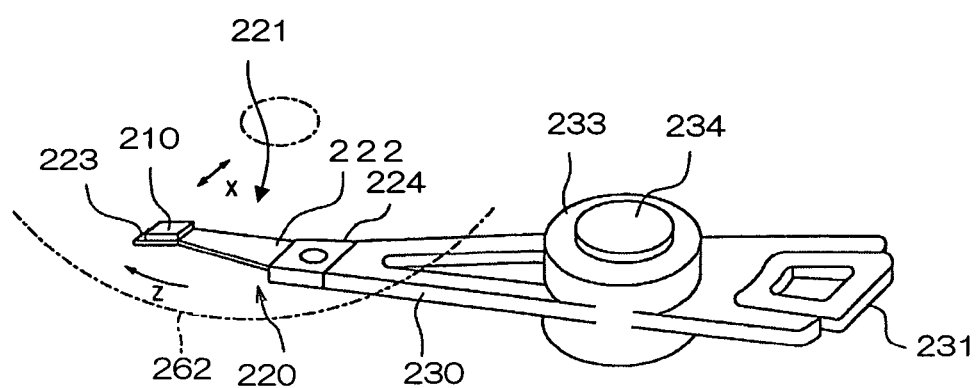
FIG. 11 is a perspective view of a head arm assembly that includes a head gimbal assembly that incorporates the thin-film magnetic head according to the present invention.

Referring to FIG. 11, head gimbal assembly 220 that has the thin-film magnetic head will be explained next. Head gimbal assembly 220 is provided with slider 210, and suspension 221 for resiliently supporting slider 210. Suspension 221 has; load beam 222 in the shape of a flat spring and made of, for example, stainless steel; flexure 223 attached to one end of load beam 222, and to which slider 210 is fixed, while providing an appropriate degree of freedom to slider 210; and base plate 224 provided on the other end of load beam 222. The portion of flexure 223 to which slider 210 is attached has a gimbal section for maintaining slider 210 in a fixed orientation.

The arrangement in which a head gimbal assembly 220 is attached to a single arm 230 is called a head arm assembly. Arm 230 moves slider 210 in the transverse direction x with regard to the track of hard disk 262. One end of arm 230 is attached to base plate 224. Coil 231, which constitutes a part of the voice coil motor, is attached to the other end of arm 230. In the intermediate portion of arm 230, bearing section 233 which has shaft 234 to rotatably hold arm 230 is provided. Arm 230 and the voice coil motor to drive arm 230 constitutes an actuator.

Figure 12:
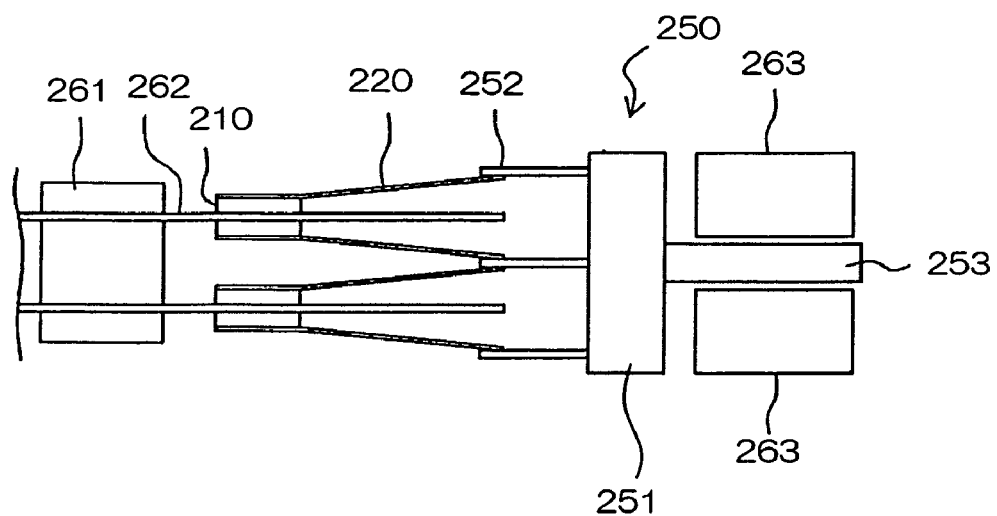
FIG. 12 is a diagram showing essential parts of a hard disk drive that incorporates the thin-film magnetic head according to the present invention.
Figure 13:
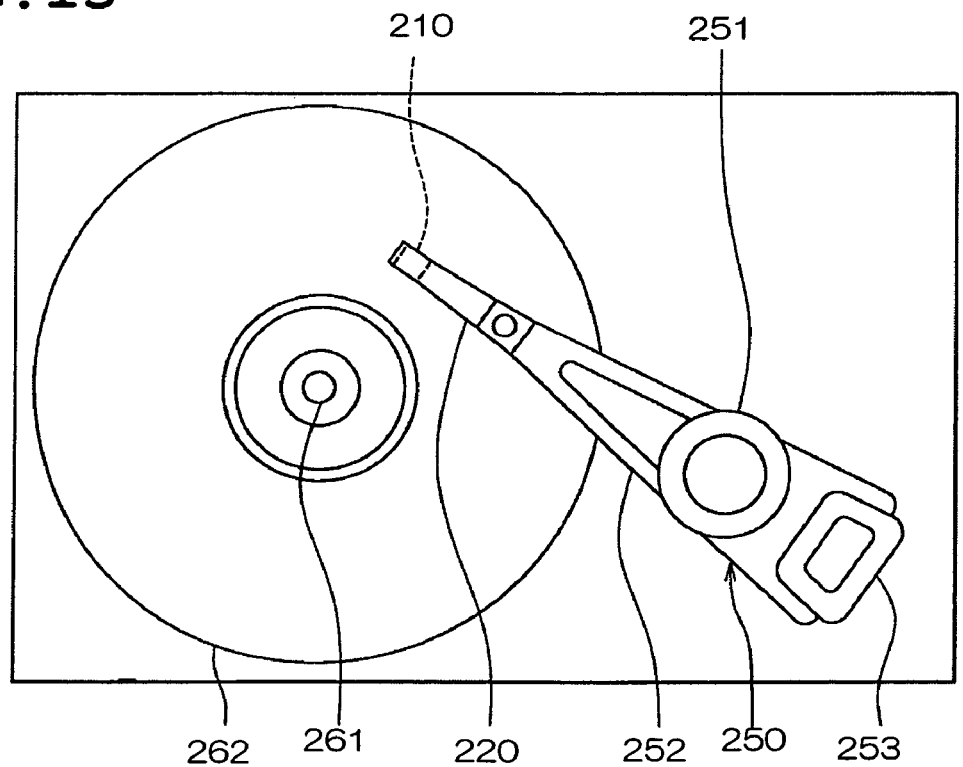
FIG. 13 is a plan view of a hard disk drive that incorporates the thin-film magnetic head according to the present invention.

Referring to FIG. 12 and FIG. 13, a head stack assembly and a hard disk drive that use the thin-film magnetic head as a head element will be explained next. The arrangement in which a head gimbal assembly 220 is attached to the respective arm of a carriage having a plurality of arms is called a head stack assembly. FIG. 12 is an explanatory diagram illustrating an essential part of a hard disk drive, and FIG. 13 is a plan view of the hard disk drive. Head stack assembly 250 has carriage 251 provided with a plurality of arms 252. A plurality of head gimbal assemblies 220 are attached to a plurality of arms 252 such that head gimbal assemblies 220 are arranged apart from each other in the vertical direction. Coil 253, which constitutes a part of the voice coil, is attached to carriage 251 on the side opposite to arms 252. The voice coil motor has permanent magnets 263 which are arranged in positions opposite to each other interposing coil 253 of head stack assembly 250 therebetween.

Referring to FIG. 12, head stack assembly 250 is installed in the hard disk drive. The hard disk drive has a plurality of hard disks connected to spindle motor 261. Two sliders 210 are arranged per each hard disk 262 at positions opposite to each other interposing hard disk 262 therebetween. Head stack assembly 250 and the actuator, except for sliders 210, work as a positioning device. They carry sliders 210 and work to position sliders 210 relative to hard disks 262. Sliders 210 are moved by the actuator in the transverse direction with regard to the tracks of hard disks 262, and positioned relative to hard disks 262. Thin-film magnetic head 1 that is contained in slider 210 records information to hard disk 262 with a write head, and reads information recorded in hard disk 262 with a read head.

The present invention was described about a magneto-resistive element of and a thin-film magnetic head using the same. However, the magneto-resistive element of the present invention can also be applied to a magnetic memory device and magnetic sensor assembly. A magnetic memory device of the present invention has a plurality of magneto-resistive elements described above, and a plurality of lines which are connected to the plurality of magneto-resistive elements. The lines are configured selectively to write information to one of the magneto-resistive elements, and selectively to read information from one of the magneto-resistive elements. A magnetic sensor assembly of the present invention has a substrate which is provided with the magneto-resistive element mentioned above and a lead line which is connected to the magneto-resistive element and which outputs magnetic information of the external magnetic field. The magnetic information is detected by the magneto-resistive element.

Although a certain preferred embodiments of the present invention have been shown and described in detail, it should be understood that various changes and modifications may be made without departing from the spirit or scope of the appended claims.

What is claimed is:

1. A magneto-resistive element comprising:
a first stacked film assembly having a pinned layer whose magnetization direction is fixed against an external magnetic field, a spacer layer that is made of a non-magnetic and conductive material, and a free layer whose magnetization is changed in accordance with the external magnetic field, said pinned layer, said spacer layer, and said free layer being arranged in this order adjacent to each other;
a first layer which is arranged such that said first layer is in contact with said free layer on one side of said first layer;
a first electrode layer which is arrange such that said first layer is in contact with said first electrode layer on an other side of said first layer, said first electrode layer being made of a ferromagnetic material;
a second electrode layer which is arranged on a side that is opposite to said first electrode layer with regard to said first stacked film assembly; and
hard magnetic layers which are disposed on both sides of at least said free layer in a plane parallel to an air bearing surface, wherein
said first and second electrode layers are adapted to apply a sense current to said first stacked film assembly and said first layer in a direction that is perpendicular to layer surfaces,
said first layer is made of gold, silver, copper, ruthenium, rhodium, iridium, chromium or platinum, or an alloy thereof,
a boundary surface of said first electrode layer that faces said first layer is formed substantially to be flat,
the sense current is adapted to flow from said second electrode layer to said first electrode layer, and
said first electrode layer is magnetized in a direction that is substantially parallel to a magnetization direction of said free layer, said free layer being magnetized by said hard magnetic layers.

2. A magneto-resistive element comprising:
a first stacked film assembly having a pinned layer whose magnetization direction is fixed against an external magnetic field, a spacer layer that is made of a non-magnetic and conductive material, and a free layer whose magnetization is changed in accordance with the external magnetic field, said pinned layer, said spacer layer, and said free layer being arranged in this order adjacent to each other;

a first layer which is arranged such that said first layer is in contact with said free layer on one side of said first layer;

a first electrode layer which is arrange such that said first layer is in contact with said first electrode layer on an other side of said first layer, said first electrode layer being made of a ferromagnetic material;

a second electrode layer which is arranged on a side that is opposite to said first electrode layer with regard to said first stacked film assembly; and hard magnetic layers which are disposed on both sides of at least said free layer in a plane parallel to an air bearing surface, wherein said first and second electrode layers are adapted to apply a sense current to said first stacked film assembly and said first layer in a direction that is perpendicular to layer surfaces, said first layer is made of gold, silver, copper, ruthenium, rhodium, iridium, chromium or platinum, or an alloy thereof, a boundary surface of said first electrode layer that faces said first layer is formed substantially to be flat, the sense current is adapted to flow from said first electrode layer to said second electrode layer, and said first electrode layer is magnetized in a direction that is substantially anti-parallel to a magnetization direction of said free layer, said free layer being magnetized by said hard magnetic layers.

3. The magneto-resistive element according to claim 1, wherein said first electrode layer has a stepped portion that projects toward said first stacked film assembly, said stepped portion extending along a direction that is substantially perpendicular to an air bearing surface, and wherein said stepped portion is magnetized in a direction that is substantially parallel to a magnetization direction of said pinned layer.

4. The magneto-resistive element according to claim 1, wherein said first layer is comprised of a plurality of layers each made of gold, silver, copper, ruthenium, rhodium, iridium, chromium or platinum, or an alloy thereof.

5. The magneto-resistive element according to claim 1, wherein said first stacked film assembly and said first layer are stacked in this order, and said first layer has a function as a cap layer.

6. The magneto-resistive element according to claim 1, wherein said first layer is made of ruthenium, and has a thickness ranging between 2 to 5 nm.

7. A thin-film magnetic head having the magneto-resistive element according to claim 1.

8. A wafer that is used to manufacture the thin-film magnetic head according to claim 7, said wafer comprising said magneto-resistive element.

9. A head gimbal assembly comprising:
a slider that includes said thin-film magnetic head according to claim 7, said slider being configured to be arranged opposite to a recording medium; and
a suspension for elastically supporting said slider.

10. A hard disk device comprising:
a slider that includes said thin-film magnetic head according to claim 7, said slider being configured to be arranged opposite to a disc-shaped recording medium that is rotatably driven; and
a positioning device for supporting said slider and for positioning said slider relative to said recording medium.

11. A magnetic memory device comprising:
a plurality of magneto-resistive elements according to claim 1;
a plurality of lines which are connected to said plurality of magneto-resistive elements, said lines being configured selectively to write information to one of said magneto-resistive elements, and selectively to read information from one of said magneto-resistive elements.

12. A magnetic sensor assembly comprising:
a substrate which is provided with the magneto-resistive element according to claim 1; and
a lead line which is connected to said magneto-resistive element and which outputs magnetic information of said external magnetic field, said magnetic information being detected by said magneto-resistive element.

13. The magneto-resistive element according to claim 2, wherein said first electrode layer has a stepped portion that projects toward said first stacked film assembly, said stepped portion extending along a direction that is substantially perpendicular to an air bearing surface, and wherein said stepped portion is magnetized in a direction that is substantially parallel to a magnetization direction of said pinned layer.

14. The magneto-resistive element according to claim 2, wherein said first layer is comprised of a plurality of layers each made of gold, silver, copper, ruthenium, rhodium, iridium, chromium or platinum, or an alloy thereof.

15. The magneto-resistive element according to claim 2, wherein said first stacked film assembly and said first layer are stacked in this order, and said first layer has a function as a cap layer.

16. The magneto-resistive element according to claim 2, wherein said first layer is made of ruthenium, and has a thickness ranging between 2 to 5 nm.

17. A thin-film magnetic head having the magneto-resistive element according to claim 2.

18. A head gimbal assembly comprising:
a slider that includes said thin-film magnetic head according to claim 17, said slider being configured to be arranged opposite to a recording medium; and
a suspension for elastically supporting said slider.

19. A hard disk device comprising:
a slider that includes said thin-film magnetic head according to claim 17, said slider being configured to be arranged opposite to a disc-shaped recording medium that is rotatably driven; and
a positioning device for supporting said slider and for positioning said slider relative to said recording medium.

20. A magnetic memory device comprising:
a plurality of magneto-resistive elements according to claim 2;
a plurality of lines which are connected to said plurality of magneto-resistive elements, said lines being configured selectively to write information to one of said magneto-resistive elements, and selectively to read information from one of said magneto-resistive elements.

21. A magnetic sensor assembly comprising:
a substrate which is provided with the magneto-resistive element according to claim 2; and
a lead line which is connected to said magneto-resistive element and which outputs magnetic information of said external magnetic field, said magnetic information being detected by said magneto-resistive element.

* * * * *